United States Patent [19]

Nakagawa et al.

[11] Patent Number: 5,248,340
[45] Date of Patent: Sep. 28, 1993

[54] DIPPING APPARATUS

[75] Inventors: Tadahiro Nakagawa; Shizuma Tazuke, both of Kyoto, Japan

[73] Assignee: Murata Manufacturing Co., Ltd., Japan

[21] Appl. No.: 840,868

[22] Filed: Feb. 25, 1992

[30] Foreign Application Priority Data

Nov. 8, 1991 [JP] Japan .................. 3-321332

[51] Int. Cl.$^5$ ................. B05C 3/02; B05C 13/00; B65G 37/00
[52] U.S. Cl. ................. 118/422; 118/423; 118/425; 118/500; 118/503; 198/346.2; 198/631
[58] Field of Search ............... 118/422, 423, 424, 425, 118/500, 503; 198/346.2, 631

[56] References Cited

U.S. PATENT DOCUMENTS

| | | | |
|---|---|---|---|
| 3,184,037 | 5/1965 | Greaves et al. | 198/631 |
| 3,603,271 | 9/1971 | Remensperger et al. | 198/631 |
| 4,104,847 | 9/1978 | Glandon et al. | 198/631 |
| 4,393,808 | 7/1983 | Braden | 118/503 |
| 4,395,184 | 7/1983 | Braden | 414/417 |
| 4,526,129 | 7/1985 | Braden | 118/503 |
| 4,654,227 | 3/1987 | Cornellier | 118/503 |
| 4,664,943 | 5/1987 | Nitta et al. | 118/500 |
| 4,669,416 | 6/1987 | Delgado et al. | 118/503 |
| 4,776,509 | 10/1989 | Tanny | 118/423 |
| 4,788,931 | 12/1989 | Nitta et al. | 118/503 |
| 4,859,498 | 8/1989 | Yamaguchi | 118/500 |
| 4,869,202 | 9/1989 | Baker | 118/425 |
| 4,958,588 | 9/1990 | Hutchison et al. | 118/423 |
| 5,120,577 | 6/1992 | Yamaguchi et al. | 118/503 |

FOREIGN PATENT DOCUMENTS

| | | |
|---|---|---|
| 3505725 | 2/1986 | Fed. Rep. of Germany . |
| 3502586 | 7/1986 | Fed. Rep. of Germany . |
| 3529313 | 2/1987 | Fed. Rep. of Germany . |
| 3829508 | 11/1989 | Fed. Rep. of Germany . |
| 3-44404 | 7/1991 | Japan . |

OTHER PUBLICATIONS

German Language: Taschenbuch Für den Machinenbau; F. Sass et al. pp. 786-795 (pp. 787 and 788 are missing).

*Primary Examiner*—W. Gary Jones
*Assistant Examiner*—Steven P. Griffin
*Attorney, Agent, or Firm*—Ostrolenk, Faber, Gerb & Soffen

[57] ABSTRACT

Take-in and take-out conveyors are provided on horizontal sides of a chucking mechanism, which is adapted to engage a workpiece and vertically move the same, and disposed flush with each other for supplying and discharging the workpiece to and from a position of the chucking mechanism. A dipping vessel is provided immediately under the chucking mechanism at a position lower than the level at which the workpiece is carried by the take-in and take-out conveyors. The take-in and take-out conveyors, which are adapted to carry the workpiece in the same direction and at the same speed, are slid/driven in approaching and separating directions between standby positions, which are opposite to each other across a vertical space of the chucking mechanism, and working positions which are located near each other immediately under the chucking mechanism. Thus, it is possible to perform dipping with high accuracy without sliding the chucking portion while protecting the workpiece against vibration and deviation.

18 Claims, 8 Drawing Sheets

DIPPING APPARATUS

BACKGROUND OF THE INVENTION

1. Field of the Invention

The present invention relates to a dipping apparatus which can automatically dip miniature components such as chip type electronic components or radial lead electronic components, and more particularly, it relates to a supplying/discharging mechanism for the dipping apparatus.

2. Description of the Background Art

In general, a holding plate having a number of receiving holes is employed for efficiently applying electrodes to end portions of a number of chip components, as disclosed in Japanese Patent Publication No. 3-44404 (1991). This holding plate comprises a hard substrate, a thin flat plate portion which is formed at a central portion of the substrate and provided with a number of through holes, and a rubber-like elastic member which is embedded in a concave portion defined in the flat plate portion and provided with receiving holes passing through the elastic member, which are smaller in diameter than the through holes. The holding plate elastically holds chip components in the receiving holes to with parts of the components projecting and brings the projected portions downwardly into contact with an upper surface of a plate which is coated with a thin film of electrode paste such as silver paste, thereby uniformly applying electrodes onto the projecting end portions of the chip components.

A dipping apparatus can be employed for automatically dipping such chip components. For example, a conceivable dipping apparatus engages every holding plate which is supplied by a conveyor with chucking pawls and downwardly moves the chucking pawls for bringing projected portions of chip components, which are held by the holding plate, into contact with an upper surface of a plate coated with electrode paste. Then the apparatus upwardly moves the chucking pawls for transferring the holding plate to a take-out conveyor.

In such a dipping apparatus, it is necessary to transfer the holding plate from a take-in conveyor to the chucking pawls and from the chucking pawls to a take-out conveyor with no vibration. If any vibration occurs during such movement, the chip components which are partially projected from the lower surface of the holding plate may drop from or incline in the receiving holes. When the chip components are not more than 3.2 mm in length, for example, only portions not more than 2.0 mm in length are received in the receiving holes. Thus, the holding plate has extremely small holding power.

The holding plate may conceivably be transferred by different methods. In a first method, a take-in conveyor may be continuously provided under the chucking pawls. In this case, however, the chucking pawls or the holding plate which is held by the chucking pawls disadvantageously interferes with the conveyor when the same is vertically moved, and hence it is impossible to maintain the holding plate in a horizontal state.

In a second method, the holding plate may be carried by a conveyor to a position in front of the chucking pawls, so that the same is pushed by a direct-acting actuator such as a cylinder onto the chucking pawls. In this case, however, the holding plate may be vibrated by impact etc. which is caused upon transfer to the chucking pawls, such that the chip components may drop from the receiving holes or the direction of the holding plate may be slightly changed so as to cause deviation in the positional relation of the components with respect to the chucking pawls.

In a third method, a conveyor may be carried to a position in front of the chucking pawls, which in turn are slid onto the conveyor. When the chucking pawls are vertically moved and horizontally slid in such a manner, however, the mechanism is complicated and accuracy of the positions for vertically moving the chucking pawls is decreased. In order to apply a constant amount of electrode paste to the chip components and prevent the lower surface of the holding plate from adhesion of the electrode paste, extremely high accuracy is required for the positions when vertically moving the chucking pawls as well as for keeping them horizontal.

SUMMARY OF THE INVENTION

Accordingly, an object of the present invention is to provide a dipping apparatus, which can accurately dip a workpiece without sliding a chucking portion, while protecting the workpiece against vibration or deviation.

In order to attain the aforementioned object, the dipping apparatus according to an embodiment of the present invention comprises a chucking mechanism for engaging and vertically moving a workpiece, take-in and take-out conveyors which are provided on horizontal sides of the chucking mechanism to be flush with each other for supplying and discharging the workpiece to and from a position of the chucking mechanism, a dipping vessel which is provided immediately under the chucking mechanism in a position lower than the level at which the workpiece is carried by the take-in and take-out conveyors, a first driving part which is adapted to carry the workpiece being supported on the take-in conveyor to the take-out conveyor, for driving the workpiece in the same direction and at the same speed as the carriage on the take-in conveyor and on the take-out conveyor, and a second driving part for sliding/driving the take-in and take-out conveyors in approaching and separating directions between standby positions being disposed opposite to each other through a vertical space of the chucking mechanism and working positions disposed approximate to each other and located immediately under the chucking mechanism.

In operation, the workpiece is first placed on the take-in conveyor which is located in its standby position. Then the second driving part slides the take-in conveyor to its working position. At this time, the take-out conveyor is also slid to its working position in synchronization with the take-in conveyor. Then the first driving part drives the take-in and take-out conveyors in the same direction and at the same speed, to move the workpiece to a position for extending across the both conveyors. Since the conveyors are flush with each other, no vibration is applied to the workpiece, which is now located immediately under the chucking mechanism. Then the chucking mechanism is downwardly moved to engage both side portions of the workpiece, and the chucking mechanism is slightly moved up to raise up the workpiece from the conveyors. Thereafter the conveyors are slid to the standby positions and separated from the chucking mechanism. Then the chucking mechanism is downwardly moved and introduced into the dipping vessel, to dip the workpiece in a required manner. Since the take-in and take-out conveyors will not interfere with the chucking mechanism in the standby positions, the chucking mechanism may be vertically moved in a simple manner and unfavorable influence is exerted on positional accuracy is avoided.

After the workpiece is dipped, the chucking mechanism is moved upwardly to a position higher than the carriage level, and the conveyors are slid to the working positions. Then the chucking mechanism is moved downwardly toward the conveyors to release the workpiece, which in turn is supported in a position extending across the conveyors. The conveyors are driven in the same direction and at the same speed, to smoothly transfer the workpiece onto the take-out conveyor and discharge the same from the apparatus. After the workpiece is thus discharged, the conveyors are moved back to the standby positions to receive a next workpiece.

The present invention is applicable, for example, to a workpiece such as a holding plate for holding chip components, a holding frame holding a number of radial lead components, an overall electronic component, or the like. In any case, the workpiece may hold components oriented downwardly for dipping the same.

In relation to the present invention, the term "dipping" indicates an operation for pressing components against the bottom surface of a vessel which is coated with a thin film of paste as hereinabove described, resin dipping, or solder dipping.

According to an aspect of the present invention, the take-in and take-out conveyors are slid/driven in approaching and separating directions between the standby positions which are located opposite to each other across a vertical space of the chucking mechanism and the working positions which are approximate to each other are located immediately under the chucking mechanism. The workpiece therefore can be smoothly transferred from the take-in conveyor to the chucking mechanism and from the chucking mechanism to the take-out conveyor. Thus, it is possible to dip a workpiece, such as a holding plate holding a number of small chip components, with no vibrations.

Further, it is not necessary to slide the chucking mechanism for transferring the workpiece, but the same may simply be moved in the vertical direction, whereby the position for vertical movement of the chucking mechanism is improved in accuracy and the mechanism can be simplified.

In addition, the take-in and take-out conveyors may simply be slid to a central position of the chucking mechanism with small strokes, and the conveyors themselves can be advantageously reduced in size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
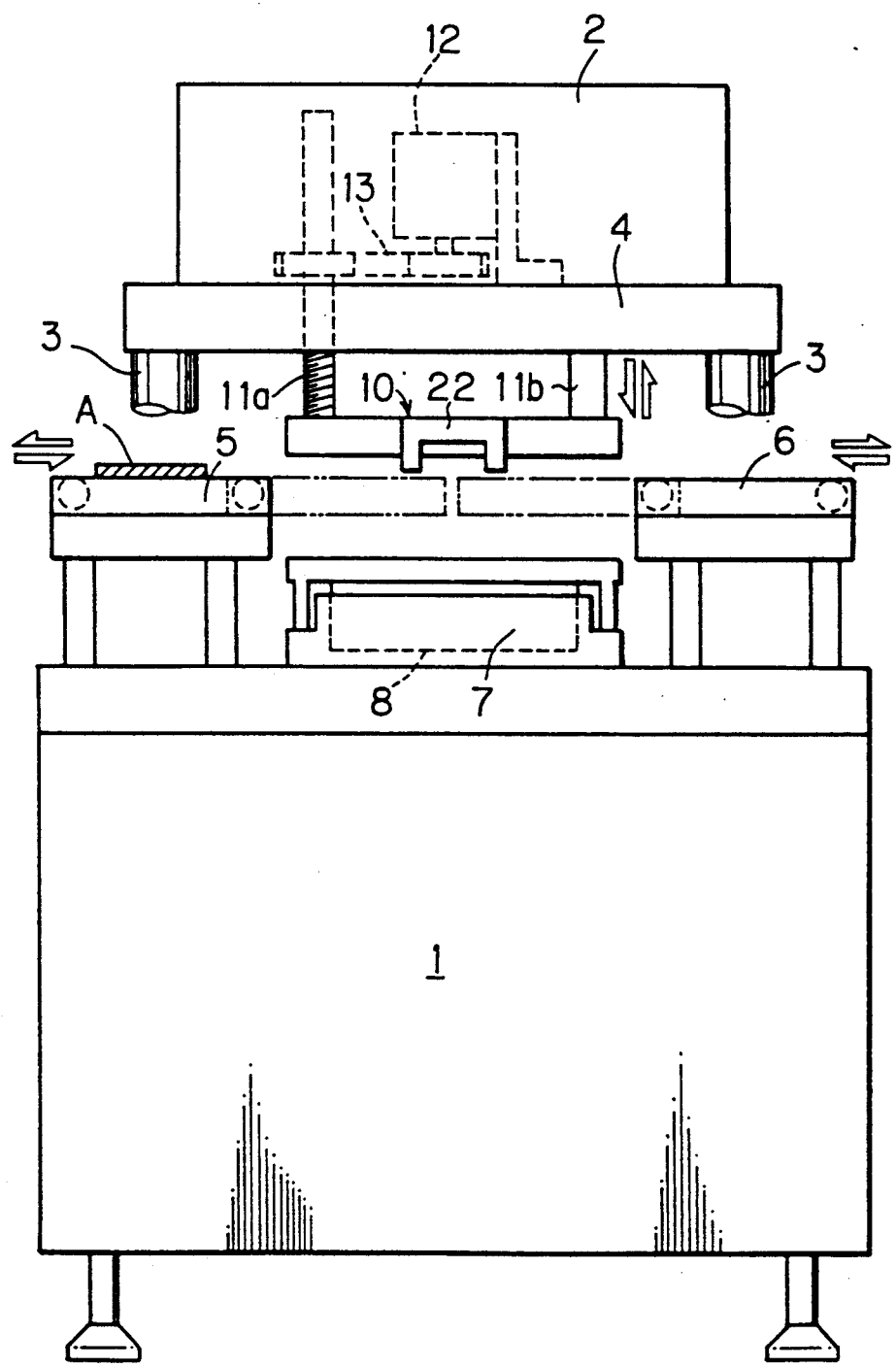
FIG. 1 is a front elevational view schematically showing a dipping apparatus according to an embodiment of the present invention.
Figure 2:
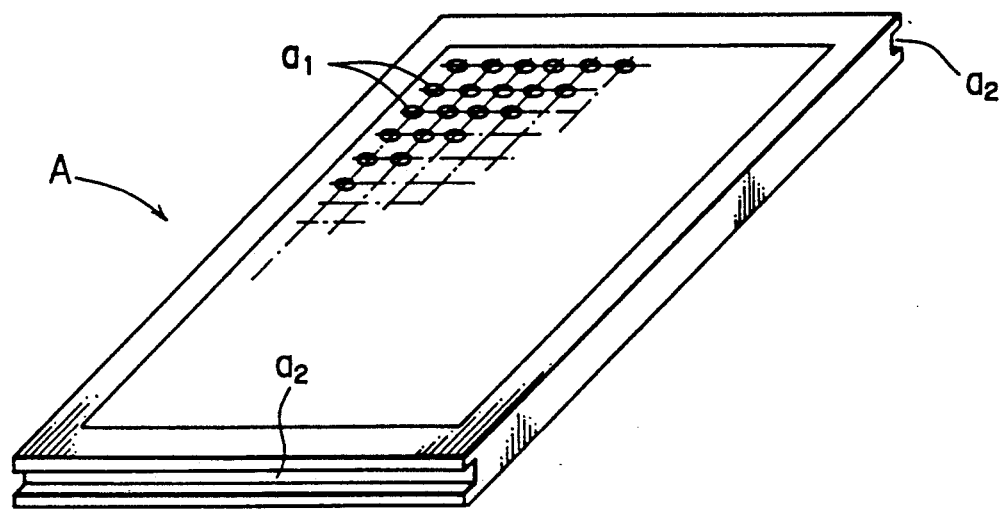
FIG. 2 is a perspective view of a holding plate which is employed in the dipping apparatus shown in FIG. 1.
Figure 3:
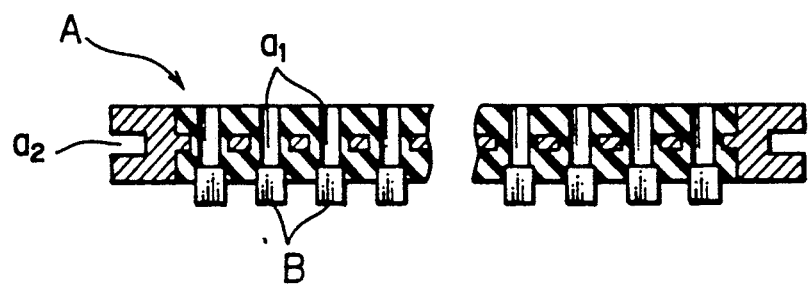
FIG. 3 is a cross-sectional view showing the holding plate holding chip components.

FIG. 1 shows a dipping apparatus according to an embodiment of the present invention, which is adapted to apply electrodes onto end portions of chip components B. As shown in FIGS. 2 and 3, the chip components B (FIG. 3) are elastically held by a holding plate A to be partially projected from receiving holes $a_1$. The structure of this holding plate A is similar to that disclosed in Japanese Patent Publication No. 3-44404 (1991).

The inventive dipping apparatus is formed by a body 1 which contains a control unit (not shown), a dip head portion 2 which is fixed onto the body 1 through fixed poles 3 and a top plate 4, a take-in conveyor 5, a take-out conveyor 6, a dipping vessel 7, and a blade portion 8.

The dip head portion 2 vertically moves a chucking mechanism 10, which is arranged under the same, through four vertical shafts 11a and 11b. The dip head portion 2 contains a motor 12 for producing vertical movement for rotating vertical shafts 11a, which are formed by two ball screws provided at diagonal positions, at the same speed through a belt 13, to vertically drive the chucking mechanism 10. The remaining vertical shafts 11b are formed by two guide shafts which are also provided at diagonal positions, and adapted to horizontally guide the vertical movement of the chucking mechanism 10. Such guide shafts may be prepared from sliding shafts or LM (linear motion) guides.

Figure 4:
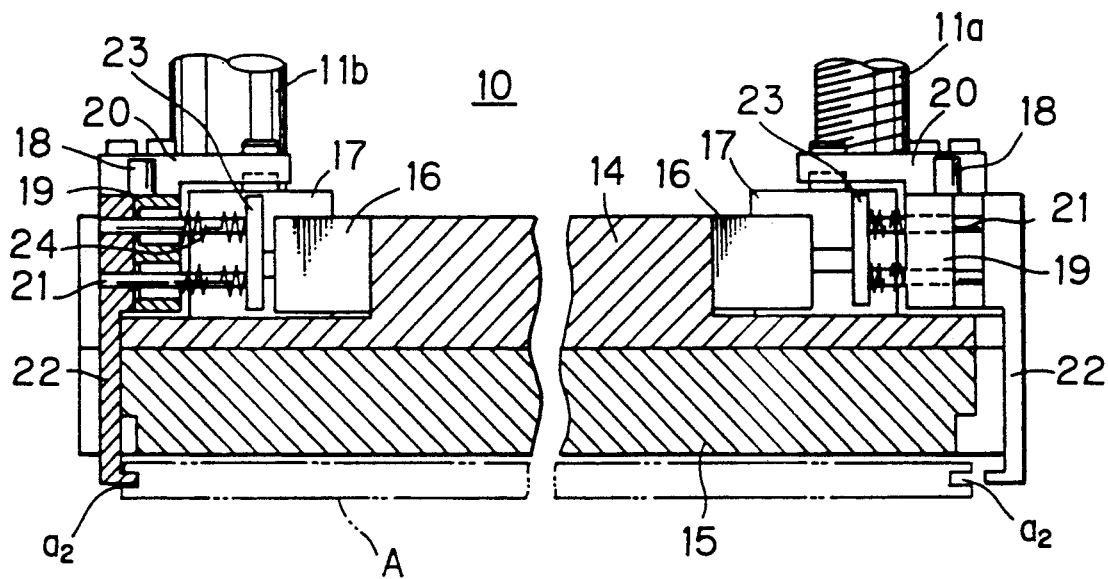
FIG. 4 is a cross-sectional view of a chucking mechanism which is included in the dipping apparatus shown in FIG. 1.
Figure 5:
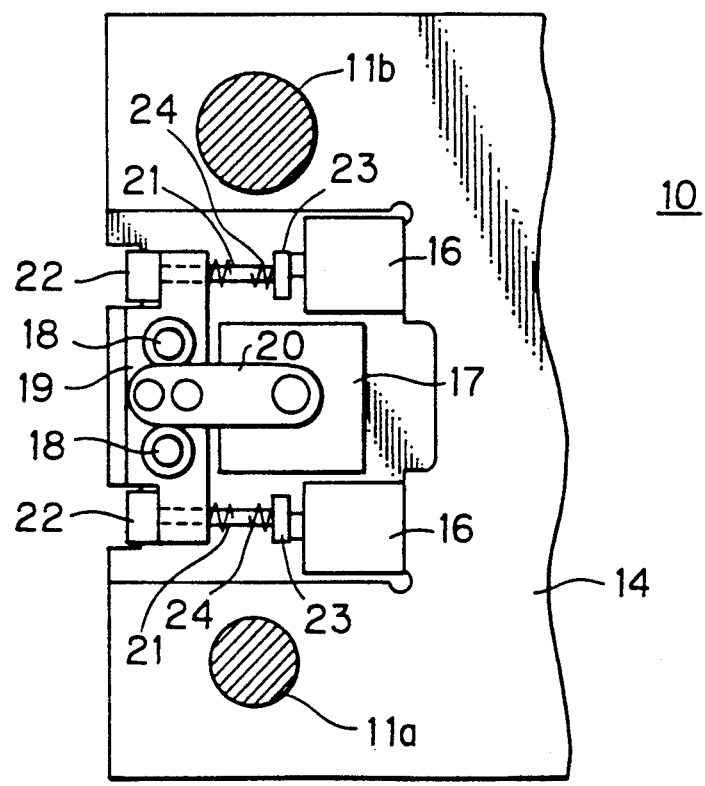
FIG. 5 is a partially fragmented plan view of the chucking mechanism shown in FIG. 4.

FIGS. 4 and 5 illustrate the chucking mechanism 10 in detail. Chucking mechanism 10 comprises a substrate 14 which is fixed to the lower end portions of the vertical shafts 11a and 11b, and a backing plate 15 which is horizontally fixed to the lower side of the substrate 14. Two switching cylinders 16 and one vertical cylinder 17 are provided on each side of the substrate 14. A pair of guide shafts 18 are fixed to the substrate 14 in upright states for guiding a vertically movable chuck holder 19, which is coupled to a piston rod of the vertical cylinder 17 through a stay 20. Thus, the chuck holder 19 is vertically movable through the vertical cylinder 17. Two vertical pairs of sliding shafts 21 slidably pass through both side portions of the chuck holder 19, while a horizontal pair of chucking pawls 22 are coupled to outer end portions of the sliding shafts 21 sliders 23 are fixed to side end portions of the sliding shafts 21 in vertically extending manners. Forward end surfaces of piston rods of the switching cylinders 16 are slidably in contact with side surfaces of the sliders 23. Contact pressure between the piston rods of the switching cylinders 16 and the sliders 23 are supplied by springs 24 which are provided on the sliding shafts 21.

In operation, in a first stage the switching cylinders 16 outwardly move the chucking pawls 22 to an open position, and the vertical cylinder 17 downwardly moves the opened chucking pawls 22 in a second stage. In a third stage, the switching cylinders 16 inwardly close the chucking pawls 22 to engage forward ends thereof with grooves $a_2$, which are provided on both sides of the holding plate A. In a fourth stage, the vertical cylinder 17 upwardly moves the closed chucking pawls 22, to bring the upper surface of the holding plate A into close contact with the backing plate 15. Since the lower surface of the backing plate 15 is regularly maintained in a horizontal state by the vertical shafts 11$a$ and 11$b$, the holding plate A is also horizontally held to maintain the projected portions of the chip components B, which are received in the receiving holes $a_1$, in horizontal states. Referring to FIG. 4, the chucking pawls 22 shown on the left side are closed while those shown on the right side are opened.

In order to release the holding plate A, an operation in reverse to the above is carried out. Namely, the chucking pawls 22 are moved downwardly in the closed states in a first stage to bring the holding plate A onto the conveyors 5 and 6 as described later, and the chucking pawls 22 are opened in a second stage to release the holding plate A. The opened chucking pawls 22 are moved upwardly in a third stage, and then inwardly closed in a fourth stage, to complete the series of operation.

Figure 6:
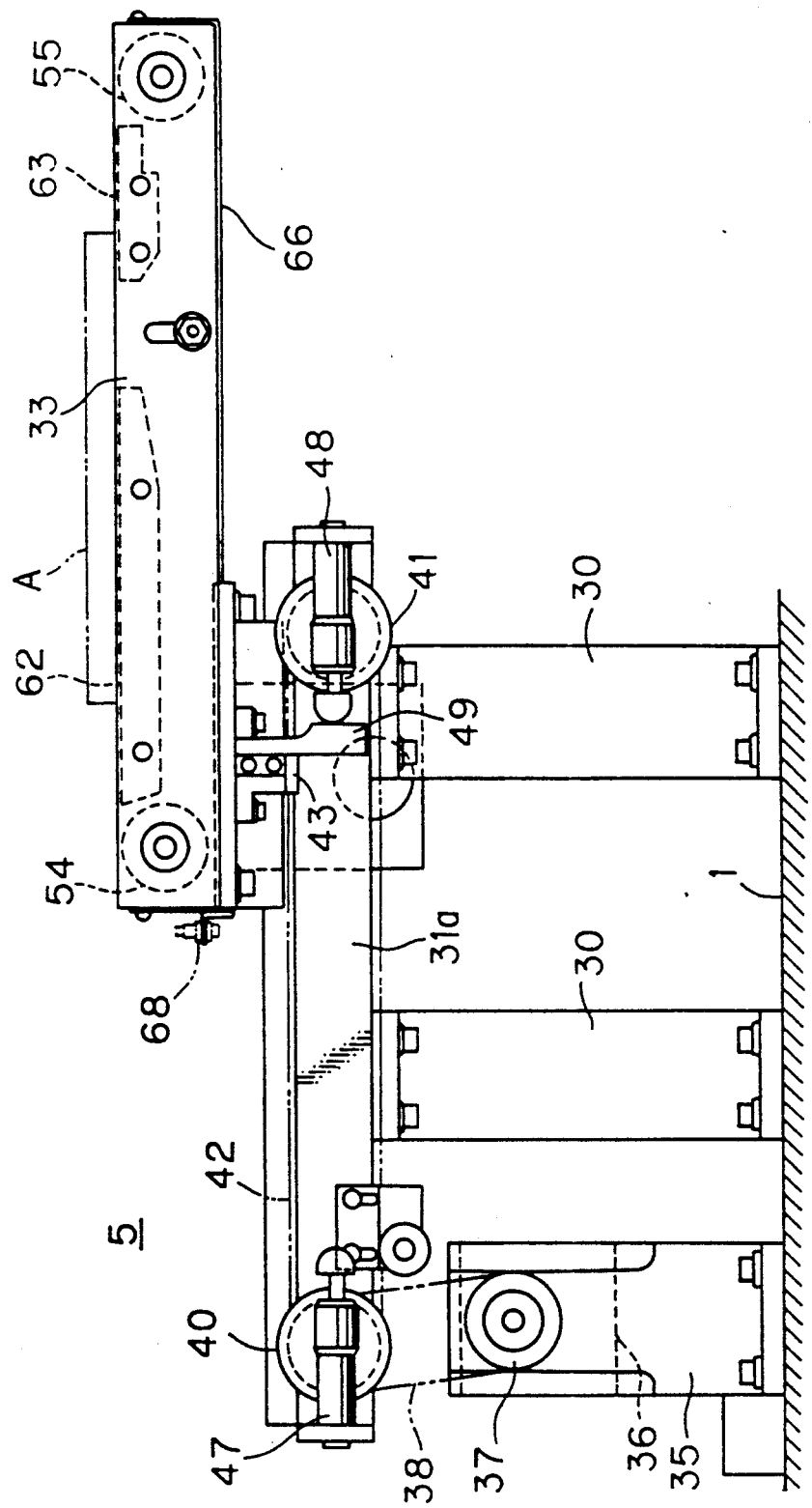
FIG. 6 is a front elevational view of a take-in conveyor, which is included in the dipping apparatus shown in FIG. 1, located in a working position.
Figure 7:
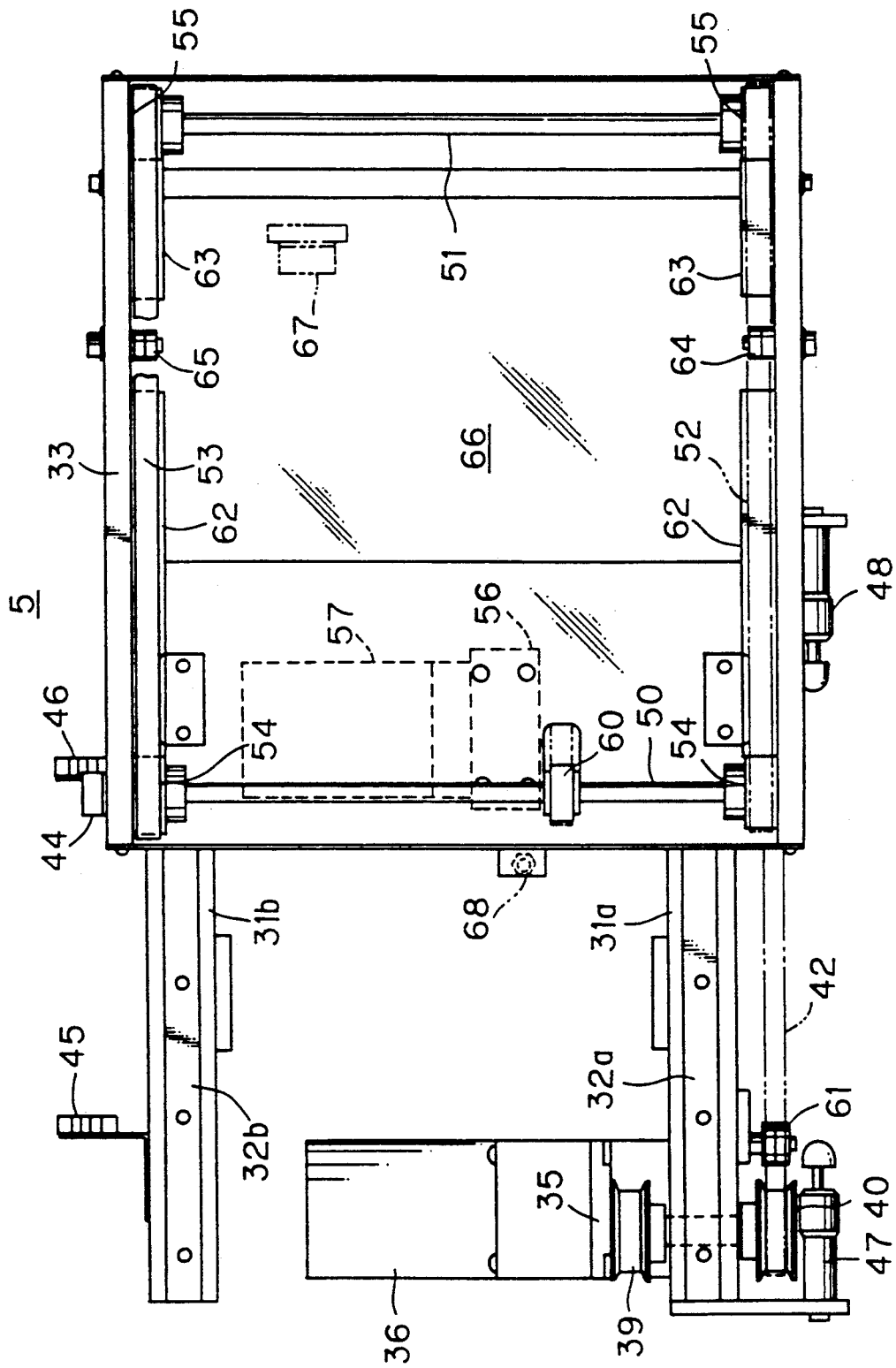
FIG. 7 is a plan view of the take-in conveyor shown in FIG. 6.
Figure 8:
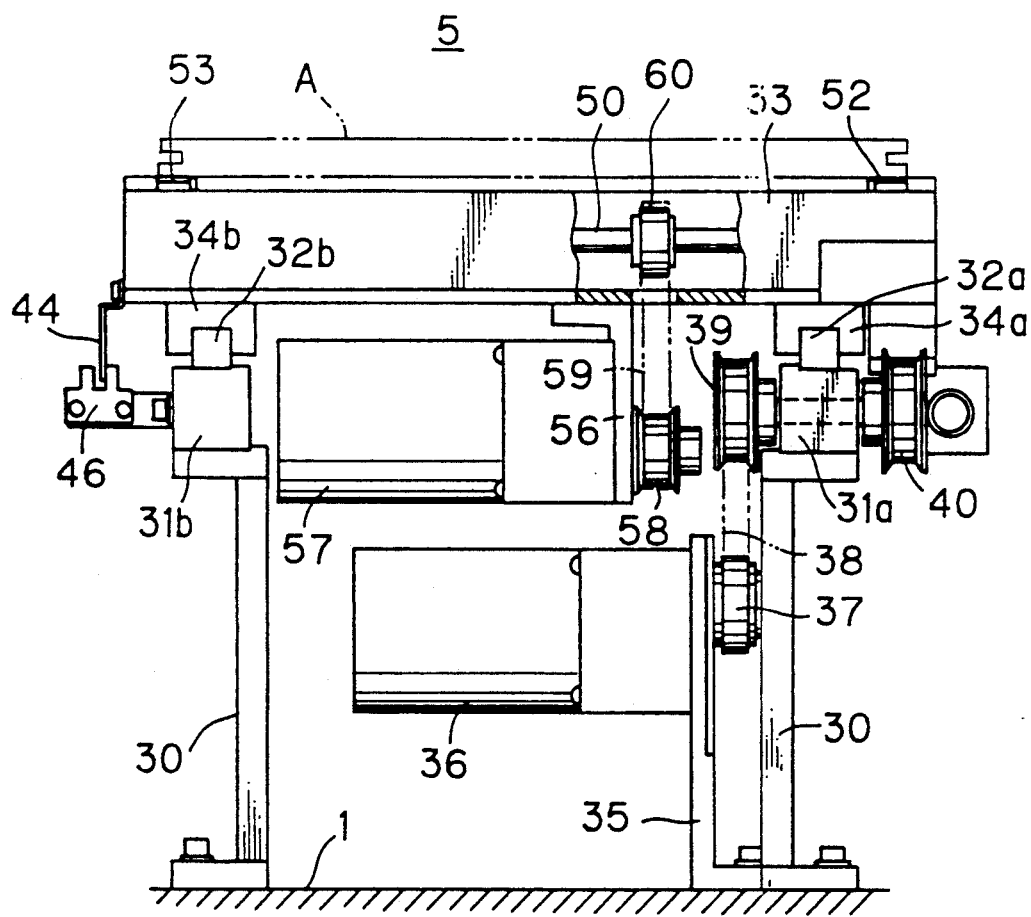
FIG. 8 is a left side elevational view of the take-in conveyor shown in FIG. 6.

FIGS. 6 to 8 show the take-in conveyor 5 in detail.

Guide rails 32$a$ and 32$b$ are horizontally provided on a pair of supports 31$a$ and 31$b$, each of which is horizontally fixed onto the body 1 through a plurality of support legs 30, so that a conveyor body 33 is slidable on the guide rails 32$a$ and 32$b$ through slide bearings 34$a$ and 34$b$. A sliding motor 36 is fixed onto the body 1 through a bracket 35, and a driving pulley 37 is mounted on the rotary shaft of this motor 36. The driving pulley 37 is coupled in a power transmittable manner with an intermediate pulley 39, which is rotatably supported by a beginning end portion of the first support 31$a$, by a belt 38. The intermediate pulley 39 is integrally rotated with a transmission pulley 40, which is located opposite pulley 39 through the support 31$a$. A sliding belt 42 extends across the transmission pulley 40 and another transmission pulley 41. Transmission pulley 41 is along guide rails 32$a$ and 32$b$ rotatably supported by a terminal end portion of the support 31. A clamp member 43 for partially clamping the sliding belt 42 is provided on the lower surface of one side portion of the conveyor body 33. Thus, it is possible to horizontally slide the conveyor body 33 41. Transmission pulley 41 is along guide rails 32$a$ and 32$b$ by driving the sliding motor 36. The motor 36, the pulleys 37, 39 and 40 and the belts 38 and 42 define a second driving part.

A beginning end position (standby position) and a terminal end position (working position) of the conveyor body 33 in sliding operation can be detected when a detection member 44 provided on one side surface of the conveyor body 33 reaches position detectors 45 and 46, which are formed by photointerruptors mounted on the second support 31$b$ with a constant space, respectively. The position detectors 45 and 46 output detection signals, to stop the sliding motor 36. In order to reduce shocks which may occur when the conveyor body 33 is stopped at the beginning and terminal end positions, a pair of shock absorbers 47 and 48 are mounted on the first support 31$a$, and a stopper 49 is fixed to the side portion of the conveyor body 33 in response thereto.

Cross-directionally extending shafts 50 and 51 are rotatably supported at front and rear portions of the conveyor body 33, and carriage pulleys 54 and 55, which are horizontally provided with carriage belts 52 and 53 mounted on both end portions of the shafts 50 and 51. The carriage belts 52 and 53 are adapted to support both side portions of the holding plate A. A carriage motor 57 is fixed to the lower surface of the conveyor body 33 through a bracket 56, and a driving pulley 58 is mounted on the rotary shaft of this motor 57. The driving pulley 58 interlocks with another pulley 60, which is mounted on an intermediate portion of the shaft 50, provided on the beginning end, through a belt 59. Thus, it is possible to drive the carriage belts 52 and 53 at the same speed by the carriage motor 57, to carry the holding plate A, which is supported on these belts 52 and 53, from the beginning end to the terminal end in a parallel manner. The motor 57, the pulleys 54, 55, 58 and 60, the shafts 50 and 51 and the belts 52, 53 and 59 define a first driving part.

The take-in conveyor 5 further comprises a tension roller 61 for supplying constant tension to the sliding belt 42, a horizontal pair of guide plates 62 and 63 for slidably supporting the lower surfaces of the carriage belts 52 and 53, tension rollers 64 and 65 for supplying constant tension to the carriage belts 52 and 53, and a rear cover 66 for preventing the dipping vessel 7 from droppage of dust etc. adhering to the carriage system.

Since the take-out conveyor 6 is symmetrical in structure to the take-in conveyor 5, redundant description is omitted. The take-out conveyor 6 is so synchronized in sliding and carrying operation with the take-in conveyor 5 that the former is slid to the working position in synchronization with the latter and carriage belts of the former are driven at the same speed and in the same direction as those of the latter.

The take-out conveyor 6 is different in structure from the take-in conveyor 5 by the presence of a photoelectric switch 67 and a proximity switch 68 which are mounted on an upper surface of a rear cover 66, which is provided on the bottom surface of a conveyor body 33, and a beginning end side surface of the conveyor body 33 respectively for detecting positions of the holding plate A, as provisionally illustrated in FIG. 7. The photoelectric switch 67 is adapted to temporarily stop the holding plate A for carrying the same from the dipping step to a subsequent step, while the proximity switch 68 is adapted to choose a position for stopping the holding plate A when the same is supported across the conveyors 5 and 6 before dipping.

Figure 9:
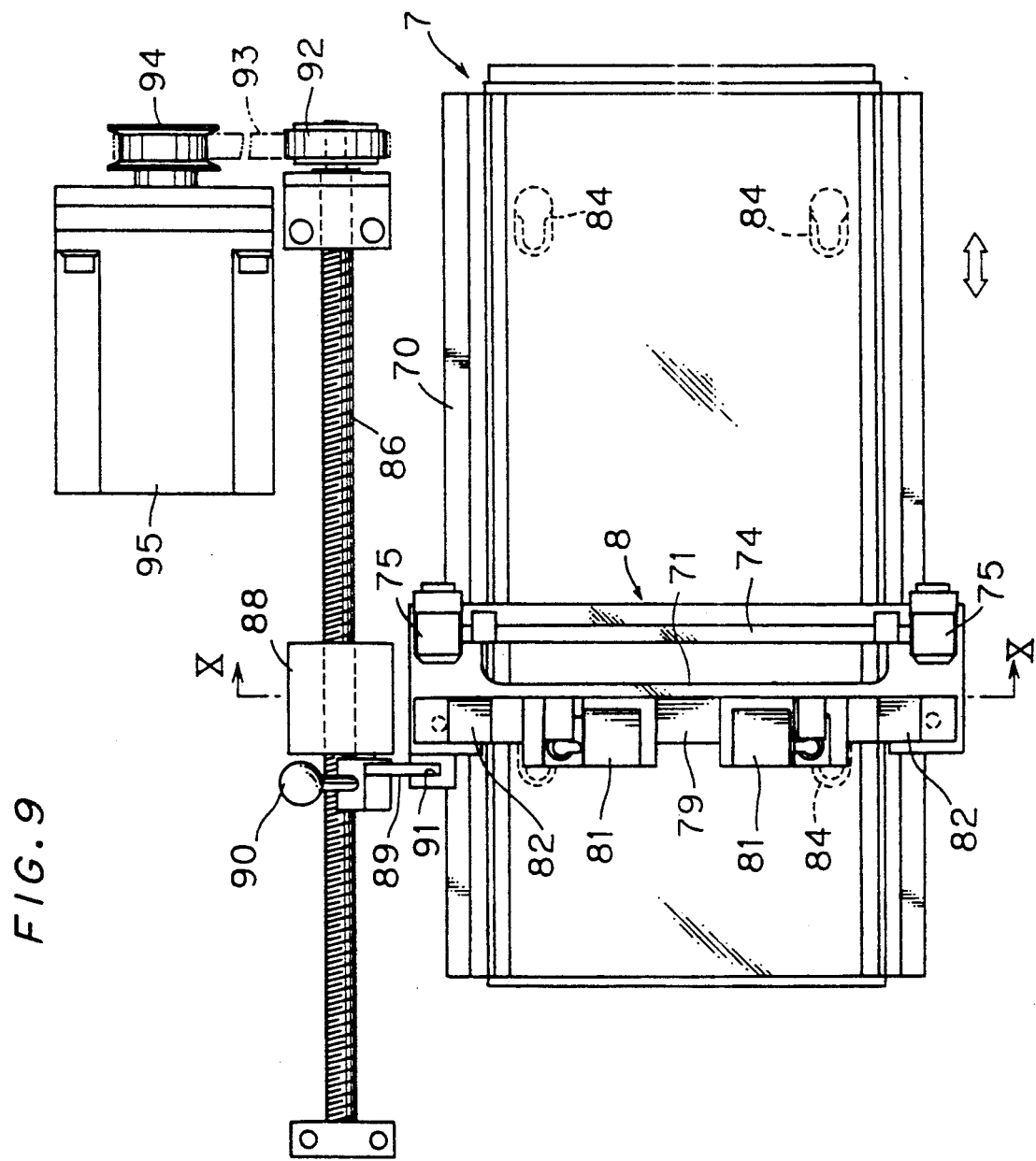
FIG. 9 is a plan view illustrating a dipping vessel and a blade portion which are included in the dipping apparatus shown in FIG. 1.
Figure 10:
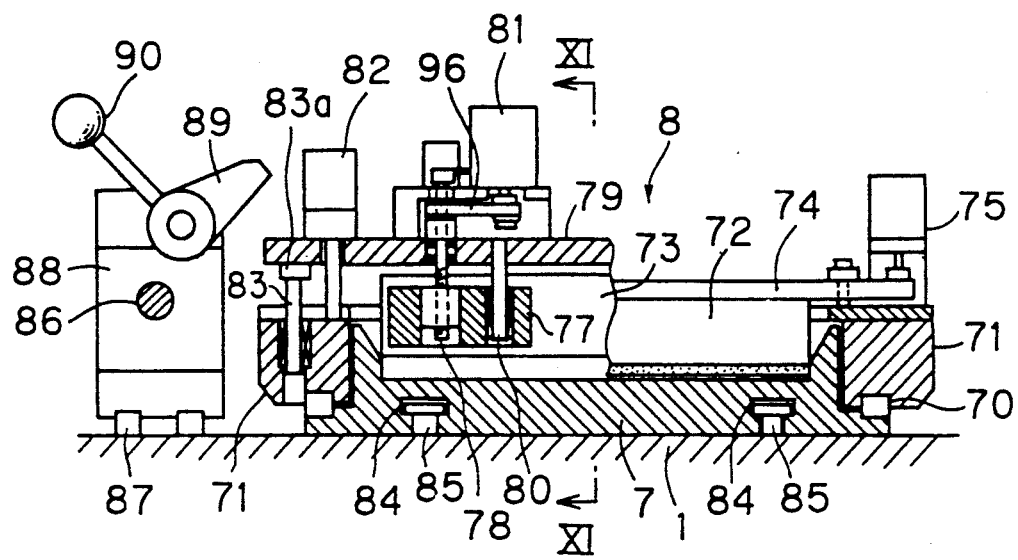
FIG. 10 is a cross-sectional view taken along the line X—X in FIG. 9.
Figure 11:
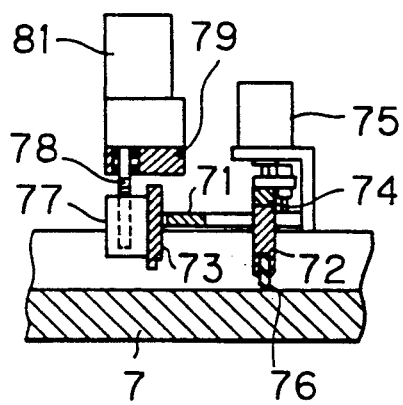
FIG. 11 is a cross-sectional view taken along the line XI—XI in FIG. 10.

FIGS. 9 to 11 illustrate the dipping vessel 7 and the blade portion 8.

The dipping vessel 7 is in the form of a rectangle having a U-shaped section, which is slightly larger than the holding plate A, and provided with guide rails 70 on both sides of longer edges thereof. A blade supporting frame 71 is slidably supported on the guide rails 70 to horizontally extend across the dipping vessel 7. A recovery blade 72 for collecting electrode paste on an end portion of the dipping vessel 7 and a levelling blade 73 for adjusting the electrode paste in a prescribed thickness are mounted on the blade supporting frame 71 in independently vertically movable manners. The blades 72 and 73 have the same widths, which are slightly smaller than the inner width of the dipping vessel 7, along shorter edges. The recovery blade 72 is fixed to the lower surface of a bridge bar 74, which is vertically movably supported on the upper portion of the blade supporting frame 71. This bridge bar 74 is vertically driven by a pair of cylinders 75, which are provided on both end portions of the blade supporting frame 71. A rubber blade member 76 is mounted on the lower end of the recovery blade 72, to be brought into close contact with the bottom surface of the dipping vessel 7.

On the other hand, a pair of blocks 77 are fixed to one side surface of the levelling blade 73, to be fitted with screw shafts 78 and slidably receive guide shafts 80, whose upper end portions are fixed to a support plate 79. The screw shafts 78 are rotatably supported by the support plate 79, and upper end portions thereof are driven by position control motors 81 through belts 96. Vertical cylinders 82 are fixed to horizontal end portions of the support plate 79, so that piston rods thereof are coupled to the blade supporting frame 71. Guide shafts 83 are downwardly projected from both end portions of the support plate 79, to be vertically movably received in the blade supporting frame 71. Thus, it is possible to vertically move the support plate 79 in a horizontal manner with respect to the blade supporting frame 71 by driving the vertical cylinders 82. Simultaneously, it is possible to finely control the vertical position of the levelling blade 73 with respect to the support plate 79 by driving the position control motors 81. The lower limit position of the support plate 79 is set by boss portions 83a of the guide shafts 83, whereby it is possible to precisely set the height of the levelling blade 73 from the bottom surface of the dipping vessel 7. In other words, it is possible to precisely control the thickness of the electrode paste which is applied to the bottom surface of the dipping vessel 7.

Four mounting holes 84, each of which has a circular end and another end having a T-shaped longitudinal section, are formed in the lower surface of the dipping vessel 7, while four headed pins 85, corresponding to the mounting holes 84, upwardly protrude from the body 1. The dipping vessel 7 is so placed on the body 1 that the circular portions of the mounting holes 84 receive the heads of the headed pins 85 and rightwardly slid in FIG. 9. Thus, the heads of the pins 85 are engaged in the T-shaped portions of the mounting holes 84, so that the dipping vessel 7 is held by the body 1 in a closely contacting contact manner.

A ball screw 86 is arranged at the back of the dipping vessel 7 in parallel with a longer edge thereof, to be fitted with a nut member 88, which is slidable along guide rails 87 provided on the body 1. An engaging member 89 having a handle 90 is provided on the nut member 88, to be swingable about a shaft which is parallel to the ball screw 86. The engaging member 89 is driven by the handle 90 to swing toward the blade supporting frame 71, and is engaged with a receiving groove 91 which is formed in a rear end portion of the blade supporting frame 71, thereby coupling the nut member 88 with the blade supporting frame 71.

A pulley 92 is mounted on a right side end of the ball screw 86. When the pulley 92 is driven by a motor 95 through a belt 93 and a pulley 94, the nut member 88 and the blade supporting frame 71 horizontally reciprocate in an integral manner. The blade member 76 of the recovery blade 72 is pressed against the bottom surface of the dipping vessel 7 and the blade supporting member 71 is driven leftwardly so that the electrode paste contained in the dipping vessel 7 is leftwardly collected. Then the recovery blade 72 is moved upward and the levelling blade 73 is moved toward the bottom surface of the dipping vessel 7 and driven rightward to form a thin film of the electrode paste on the bottom surface of the dipping vessel 7. The projected portions of the chip components B, which are held by the holding plate A, are brought into contact with this paste film, to be coated with electrodes. Since it is necessary to strictly set the lower surface of the holding plate A in parallel with the bottom surface of the dipping vessel 7, the degrees of parallelization of the upper surface of the body 1 supporting the dipping vessel 7 and the backing plate 15 of the chucking mechanism 10 are strictly adjusted.

When the engaging member 89 is disengaged from the receiving groove 91 and the mounting holes 84 formed in the bottom surface of the dipping vessel 7 are separated from the pins 85 provided on the body 1, the dipping vessel 7 can be simply replaced by another vessel. In other words, it is possible to replace the paste by another type without removing the paste adhering to the dipping vessel 7 and the blades 72 and 73, whereby the exchange time can be extremely reduced.

In this embodiment, the belts are formed by timing belts and the pulleys are formed by toothed pulleys. While all cylinders are formed by air cylinders, the same may alternatively be formed by solenoids. The motor 12 for vertically moving the chucking mechanism and the motor 95 for driving the blades are formed by servo motors, the sliding motor 36 and the carriage motor 57 are formed by reversible motors, and the blade control motors 81 are formed by pulse motors, respectively.

The dipping apparatus according to the present invention is applicable not only to the aforementioned step of applying electrodes to the chip components B which are held by the holding plate A, but also to another use.

Figure 12:
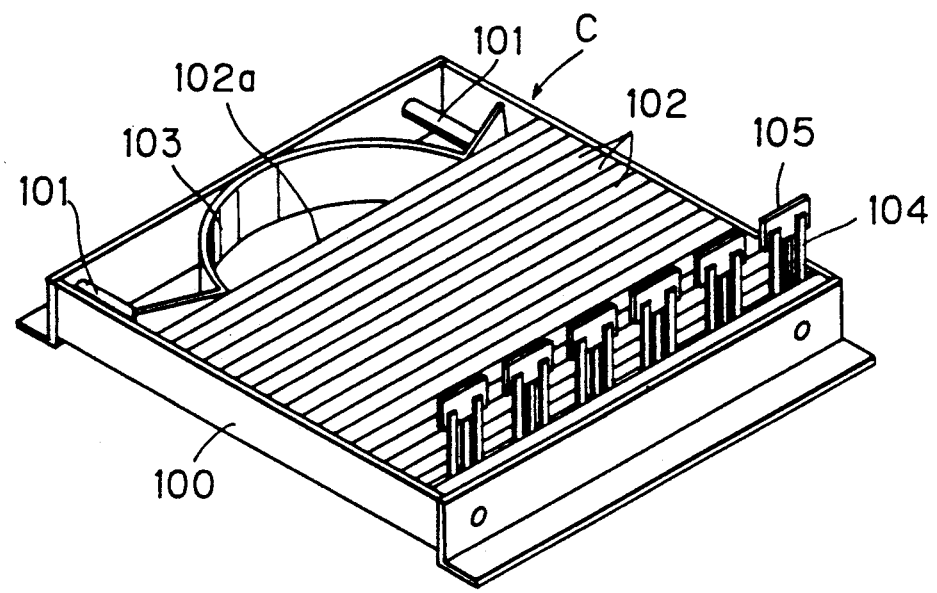
FIG. 12 is a perspective view showing another exemplary workpiece.

FIG. 12 shows another exemplary workpiece of a holder C, which is employed for dip-coating radial lead components with resin layers. In this holder C, two supports 101 are fixed in parallel in a rectangular frame body 100, to slidably pass through a number of support plates 102, as well as both ends of a bent plate spring 103. Strip portions of lead frames 104 are inserted between the support plates 102, and the plate spring 103 is interposed in a deformed state between the endmost support plate 102a and the inner surface of the frame body 100, thereby pressing/holding the lead frames 104 between the support plates 102. Although FIG. 12 illustrates only one lead frame 104, a plurality of lead frames 104 are normally disposed between the support plates 102.

The holder C is inverted to downwardly direct elements 105, which are mounted on the lead frames 104, and carried by take-in and take-out conveyors to a position above a dipping vessel containing liquid resin. Then the holder C is engaged by a chucking mechanism and introduced into the dipping vessel, thereby forming armoring resin layers around the elements 105.

Although the present invention has been described and illustrated in detail, it is clearly understood that the same is by way of illustration and example only and is not to be taken by way of limitation, the scope of the present invention being limited only by the terms of the appended claims.

What is claimed is:

1. A dipping apparatus comprising:
   a chucking mechanism for engaging a workpiece and vertically moving the same;
   take-in and take-out conveyors provided on sides of and spaced horizontally from said chucking mechanism and flush with each other for supplying and discharging said workpiece to and from a position of said chucking mechanism, wherein each of said take-in and take-out conveyors are symmetrical in structure to each other, and each comprises a pair of guide rails and a conveyor body which is slidable along said guide rails;
   a dipping vessel immediately under said chucking mechanism and at a position below a level at which said workpiece is carried by the respective take-in and take-out conveyors;
   a first driving part, including means adapted to carry said workpiece being supported on said take-in conveyor onto said take-out conveyor, for driving said workpiece in the same direction and at the same speed for being carried on said take-in conveyor and on said take-out conveyor; and
   a second driving part for driving said take-in and take-out conveyors in approaching and separating directions between standby positions, where said take-in and take-out conveyors are located opposite to each other across a vertical space of said chucking mechanism, and working positions, where said take-in and take-out conveyors are disposed immediately under said chucking mechanism, said second driving part comprising a pair of pulleys provided in fixed positions with respect to said guide rails, belts extending across said pair of pulleys, clamp members for partially fixing said belts to said conveyor body, and a motor for driving one of said pairs of pulleys.

2. A dipping apparatus in accordance with claim 1, wherein said chucking mechanism comprises a backing plate having a horizontal plane formed by a lower surface, and a pair of movable chucking pawls provided under said backing plate, wherein said pair of chucking pawls can be moved toward and away from each other and vertically displaceable together.

3. A dipping apparatus in accordance with claim 1, wherein said first driving part comprises a pair of parallel shafts each having opposed first and second ends rotatably supported by said conveyor body, a pulley mounted on each of said first and second ends of each of said shafts respectively, a first belt extending across each said pulley mounted on said first ends of said shafts, a second belt extending across each said pulley mounted on said second ends of said shafts, and a motor for driving one of said shafts.

4. A dipping apparatus in accordance with claim 3, further comprising a recovery blade vertically movable with respect to a bottom surface of said dipping vessel to selectively contact said bottom surface of said dipping vessel, a height-controllable levelling blade, and means for guiding said recovery and levelling blades across said dipping vessel.

5. A dipping apparatus in accordance with claim 1, further comprising a recovery blade vertically movable with respect to a bottom surface of aid dipping vessel to selectively contact said bottom surface of said dipping vessel, a height-controllable levelling blade, and means for guiding said recovery and levelling blades across said dipping vessel.

6. A dipping apparatus in accordance with claim 1, wherein said second driving part slides said take-in and take-out conveyors.

7. A dipping apparatus comprising:
   a chucking mechanism for engaging a workpiece and vertically moving the same;
   take-in and take-out conveyors provided on sides off and spaced horizontally from said chucking mechanism and flush with each other for supplying and discharging said workpiece to and from a position of said chucking mechanism, wherein each of said take-in and take-out conveyors are symmetrical in structure to each other, and each comprises a pair of guide rails and a conveyor body which is slidable along said guide rails;
   a dipping vessel immediately under said chucking mechanism and at a position below a level at which said workpiece is carried by the respective take-in and take-out conveyors;
   a first driving part, including means adapted to carry said workpiece being supported on said take-in conveyor onto said take-out conveyor, for driving said workpiece in the same direction and at the same speed for being carried on said take-in conveyor and on said take-out conveyor, said first driving part comprising a pair of parallel shafts each having first and second opposed end rotatably supported by said conveyor body, a pulley mounted on each of said first and second ends of each of said shafts respectively, a first belt extending across each said pulley mounted on said first ends of said shafts, a second belt extending across each said pulley mounted on said second ends of said shafts, and a motor for driving one of said shafts; and
   a second driving part for driving said take-in and take-out conveyors in approaching and separating directions between standby positions, where said take-in and take-out conveyors are located opposite to each other cross a vertical space of said chucking mechanism, and working positions, where said take-in and take-out conveyors are disposed immediately under said chucking mechanism.

8. A dipping apparatus in accordance with claim 7, wherein said chucking mechanism comprises a backing plate having a horizontal plane formed by a lower surface, and a pair of movable chucking pawls provided under said backing plate, wherein each pair of chucking pawls can be moved toward and away from each other and vertically displaceable together.

9. A dipping apparatus in accordance with claim 7, further comprising a recovery blade vertically movable with respect to a bottom surface of said dipping vessel to selectively contact said bottom surface of said dipping vessel, a height-controllable levelling blade, and means for guiding said recovery and levelling blades across said dipping vessel.

10. A dipping apparatus in accordance with claim 7, wherein said second driving part slides said take-in and take-out conveyors.

11. A dipping apparatus comprising:
    a chucking mechanism for engaging a workpiece and vertically moving the same;
    take-in and take-out conveyors provided on sides of and spaced horizontally from said chucking mechanism and flush with each other for supplying and discharging said workpiece to and from a position of said chucking mechanism;

a dipping vessel immediately under said chucking mechanism and at a position below a level at which said workpiece is carried by the respective take-in and take-out conveyors;

a first driving part, including means adapted to carry said workpiece being supported on said take-in conveyor onto said take-out conveyor, for driving said workpiece in the same direction and at the same speed for being carried on said take-in conveyor and on said take-out conveyor;

a second driving part for driving said take-in and take-out conveyors in approaching and separating directions between standby positions, where said take-in and take-out conveyors are located opposite to each other across a vertical space of said chucking mechanism, and working positions, where said take-in and take-out conveyors are disposed immediately under said chucking mechanism; and a recovery blade vertically movable with respect to a bottom surface of said dipping vessel to selectively contact said bottom surface of said dipping vessel, a height-controllable levelling blade, and means for guiding for recovery and levelling blades across said dipping vessel.

12. A dipping apparatus in accordance with claim 11, wherein said chucking mechanism comprises a backing plate having a horizontal plane formed by a lower surface, and a pair of movable chucking pawls provided under said backing plate, wherein said pair of chucking pawls can be moved toward and away from each other and vertically displaceable together.

13. A dipping apparatus in accordance with claim 11, wherein each of said take-in and take-out conveyors are symmetrical in structure to each other, and each comprises a pair of guide rails and a conveyor body which is slidable along said guide rails.

14. A dipping apparatus in accordance with claim 11, wherein said workpiece comprises a plurality of chip components held by a holding plate, each chip component including a projected portion, and said dipping vessel is charged with electrode paste for coating said projected portions of said chip components.

15. A dipping apparatus in accordance with claim 11, wherein said workpiece comprises a plurality of radial lead components held by a holder through lead frames respectively, and said dipping vessel is charged with liquid resin for coating said radial lead components.

16. A dipping apparatus in accordance with claim 11, wherein said second driving part slides said take-in and take-out conveyors.

17. A dipping apparatus in accordance with claim 11, wherein said first driving part comprises a pair of parallel shafts each having opposed first and second ends rotatably supported by said conveyor body, a pulley mounted on each of said first and second ends of each of said shafts respectively, a first belt extending across each said pulley mounted on said first ends of said shafts, a second belt extending across each said pulley mounted on said second ends of said shafts, and a motor for driving one of said shafts.

18. A dipping apparatus in accordance with claim 11, wherein said second driving part comprises a pair of pulleys provided in fixed positions with respect to said guide rails, belts extending across said pair of pulleys, clamp members for partially fixing said belts to said conveyor body, and a motor for driving one of said pairs of pulleys.

* * * * *